United States Patent
Park et al.

(10) Patent No.: US 11,594,559 B2
(45) Date of Patent: Feb. 28, 2023

(54) DISPLAY DEVICE AND METHOD OF MANUFACTURING THE SAME

(71) Applicant: Samsung Display Co., LTD., Yongin-si (KR)

(72) Inventors: Joon Seok Park, Yongin-si (KR); So Young Koo, Yongin-si (KR); Eok Su Kim, Seoul (KR); Hyung Jun Kim, Seoul (KR); Sang Woo Sohn, Yongin-si (KR); Jun Hyung Lim, Seoul (KR); Kyung Jin Jeon, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 97 days.

(21) Appl. No.: 17/157,184

(22) Filed: Jan. 25, 2021

(65) Prior Publication Data

US 2021/0327910 A1 Oct. 21, 2021

(30) Foreign Application Priority Data

Apr. 20, 2020 (KR) ........................ 10-2020-0047593

(51) Int. Cl.
*H01L 27/00* (2006.01)
*H01L 29/00* (2006.01)
*H01L 27/12* (2006.01)

(52) U.S. Cl.
CPC ......... *H01L 27/124* (2013.01); *H01L 27/127* (2013.01); *H01L 27/1225* (2013.01); *H01L 27/1237* (2013.01); *H01L 27/1288* (2013.01)

(58) Field of Classification Search
CPC ............. H01L 27/1237; H01L 27/1225; H01L 27/124; H01L 27/127; H01L 27/1288;
(Continued)

(56) References Cited

U.S. PATENT DOCUMENTS 9,437,831 B2 * 9/2016 Yamazaki ......... H01L 29/66969
10,153,446 B2 * 12/2018 Maruyama .......... H01L 27/1251
(Continued)

FOREIGN PATENT DOCUMENTS

| JP | 2019-24105 | 2/2019 |
| JP | 6467171 | 2/2019 |

(Continued)

*Primary Examiner* — Nikolay K Yushin
(74) *Attorney, Agent, or Firm* — Kile Park Reed & Houtteman PLLC

(57) ABSTRACT

A display device may include a first gate electrode disposed on a substrate, a buffer layer disposed on the first gate electrode, a first active pattern on the buffer layer, the first active pattern overlapping the first gate electrode and including an oxide semiconductor, a second active pattern on the buffer layer, spaced apart from the first active pattern, and including an oxide semiconductor, the second active pattern including a channel region, and a source region and a drain region, a source pattern and a drain pattern respectively at ends of the first active pattern, a first insulation pattern disposed on the first active pattern, a second insulation pattern disposed on the channel region, a first oxygen supply pattern on the first insulation pattern, a second oxygen supply pattern on the second insulation pattern, and a second gate electrode on the second oxygen supply pattern.

22 Claims, 19 Drawing Sheets

(58) Field of Classification Search
CPC ........... H01L 29/78648; H01L 29/4908; H01L 29/78606; H01L 29/66969; H01L 29/7869
See application file for complete search history.

(56) References Cited

U.S. PATENT DOCUMENTS

| | | | |
|---|---|---|---|
| 2015/0155505 A1* | 6/2015 | Yamazaki | H01L 29/66969 257/40 |
| 2018/0090695 A1* | 3/2018 | Maruyama | H01L 27/1255 |
| 2020/0203534 A1* | 6/2020 | Park | H01L 29/78633 |

FOREIGN PATENT DOCUMENTS

| KR | 10-2008-0113967 | 12/2008 |
|---|---|---|
| KR | 10-2018-0070334 | 6/2018 |
| KR | 10-1895421 | 9/2018 |

* cited by examiner

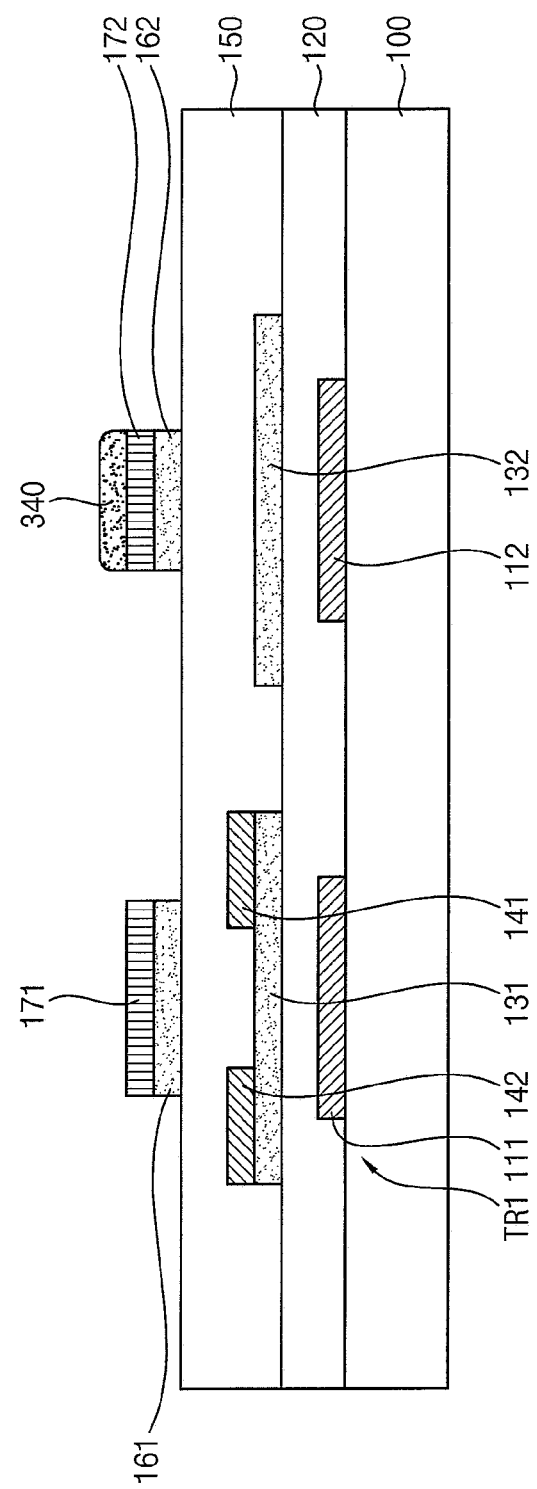

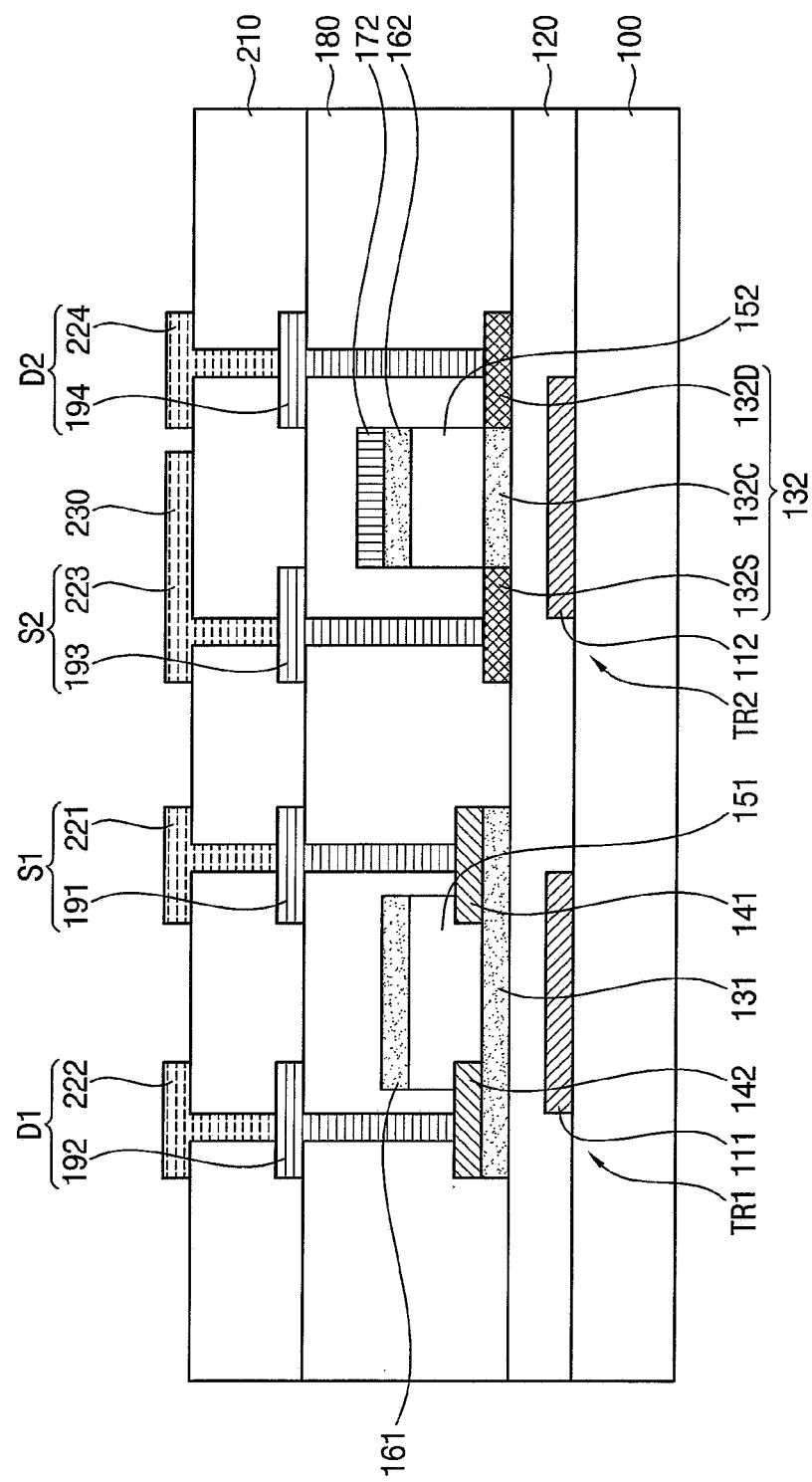

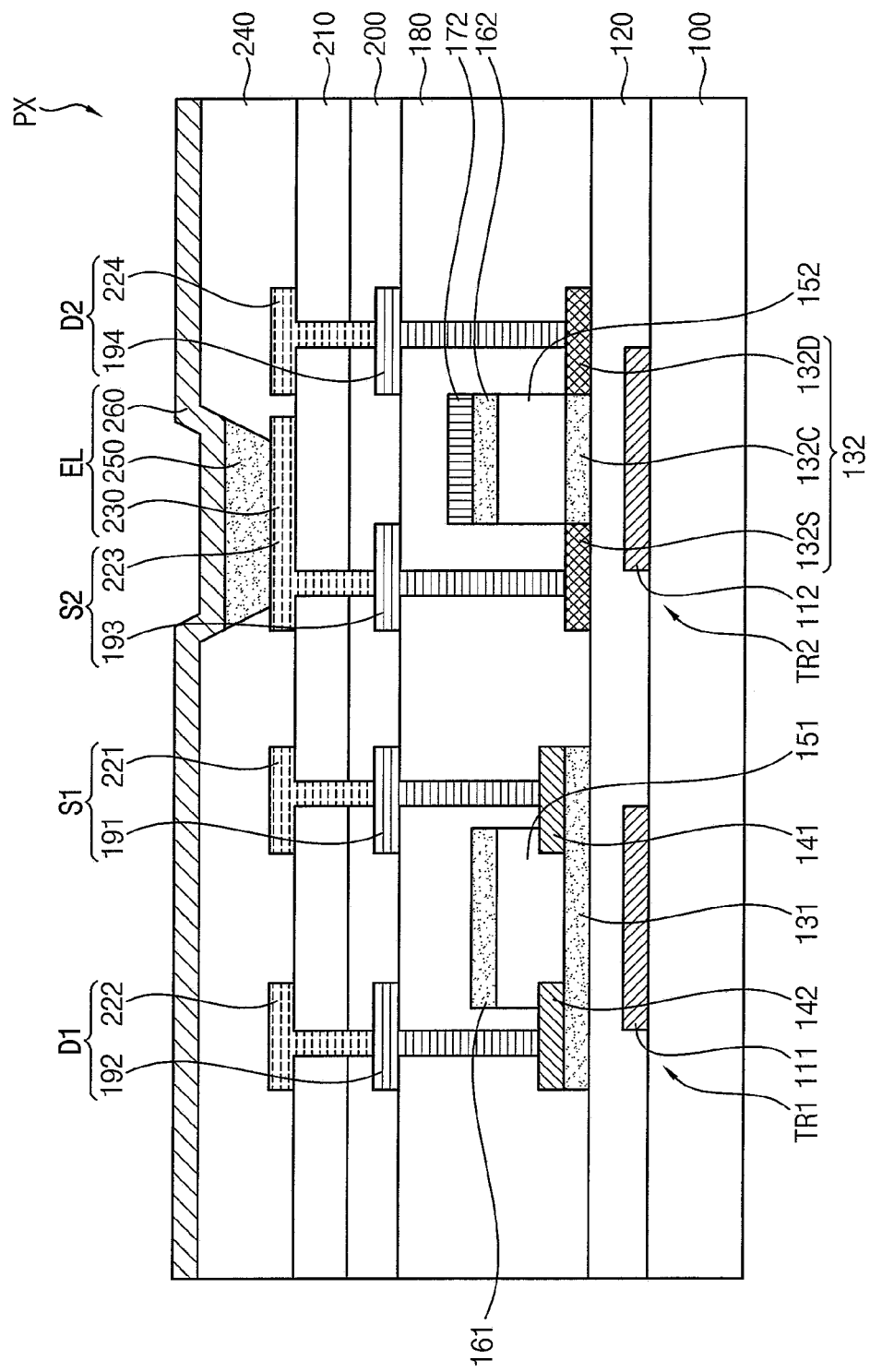

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0047593, under 35 U.S.C. § 119, filed in the Korean Intellectual Property Office (KIPO) on Apr. 20, 2020, the entire contents of which are herein incorporated by reference.

BACKGROUND

1. Technical Field

Embodiments relate to a display device including transistors.

2. Description of the Related Art

A display device may include pixels and a driver for driving the pixels. Each of the pixels and the driver may include transistors.

An area in which the transistors may be disposed may decrease due to an increase of the resolution of the display device and a decrease of dead space of the display device, dead space being space which is devoted to accommodating one or more components that perform an intended function. Accordingly, electrical characteristics of the transistors disposed in a relatively narrow space may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device including transistors having improved electrical characteristics.

Embodiments may provide a method of manufacturing a display device to reduce a manufacturing cost and a manufacturing time.

A display device according to an embodiment may include a first gate electrode disposed on a substrate, a buffer layer disposed on the first gate electrode, a first active pattern disposed on the buffer layer, the first active pattern overlapping the first gate electrode and including an oxide semiconductor, a second active pattern disposed on the buffer layer, spaced apart from the first active pattern, and including an oxide semiconductor, the second active pattern including a channel region, and a source region and a drain region respectively disposed at ends of the channel region. The display device may include a source pattern and a drain pattern respectively disposed at ends of the first active pattern, a first insulation pattern disposed on the first active pattern between the source pattern and the drain pattern, a second insulation pattern disposed on the channel region of the second active pattern, a first oxygen supply pattern disposed on the first insulation pattern, the first oxygen supply pattern supplying oxygen to the first active pattern, a second oxygen supply pattern disposed on the second insulation pattern, the second oxygen supply pattern supplying oxygen to the second active pattern, and a second gate electrode disposed on the second oxygen supply pattern.

In an embodiment, each of the first oxygen supply pattern and the second oxygen supply pattern may include an oxide semiconductor.

In an embodiment, the first oxygen supply pattern, the second oxygen supply pattern, the first active pattern, and the second active pattern may include a same material.

In an embodiment, the first oxygen supply pattern and the second oxygen supply pattern may include a material different from a material of the first active pattern and the second active pattern.

In an embodiment, the display device may further include an insulation interlayer overlapping the first oxygen supply pattern and the second gate electrode on the buffer layer, a first source electrode and a first drain electrode disposed on the insulation interlayer and respectively electrically connected to the source pattern and the drain pattern, and a second source electrode and a second drain electrode disposed on the insulation interlayer and respectively electrically connected to the source region and the drain region.

In an embodiment, the display device may further include a planarization layer disposed on the insulation interlayer. The first source electrode may include a first lower source electrode disposed on an upper surface of the insulation interlayer, and a first upper source electrode disposed on an upper surface of the planarization layer and electrically connected to the first lower source electrode. The first drain electrode may include a first lower drain electrode disposed on the upper surface of the insulation interlayer, and a first upper drain electrode disposed on the upper surface of the planarization layer and electrically connected to the first lower drain electrode. The second source electrode may include a second lower source electrode disposed on the upper surface of the insulation interlayer, and a second upper source electrode disposed on the upper surface of the planarization layer and electrically connected to the second lower source electrode. The second drain electrode may include a second lower drain electrode disposed on the upper surface of the insulation interlayer, and a second upper drain electrode disposed on the upper surface of the planarization layer and electrically connected to the second lower drain electrode.

In an embodiment, the display device may further include a protective layer disposed between the insulation interlayer and the planarization layer, the protective layer overlapping the first lower source electrode, the first lower drain electrode, the second lower source electrode, and the second lower drain electrode.

In an embodiment, the display device may further include a planarization layer disposed on the insulation interlayer. The first source electrode, the first drain electrode, the second source electrode, and the second drain electrode may be disposed on an upper surface of the planarization layer.

In an embodiment, the display device may further include a conductive pattern disposed between the substrate and the buffer layer and overlapping the second active pattern.

In an embodiment, the conductive pattern may be electrically connected to the second source electrode or the second gate electrode.

In an embodiment, the display device may further include a data line disposed between the substrate and the buffer layer, the data line being electrically connected to the first drain electrode.

In an embodiment, the display device may further include a driving voltage line disposed between the substrate and the buffer layer, the driving voltage line being electrically connected to the second drain electrode.

A display device according to an embodiment may include a first transistor disposed on a substrate and having a bottom gate structure, the first transistor including a first active pattern including an oxide semiconductor, a second transistor disposed on the substrate and having a top gate structure, the second transistor including a second active pattern including an oxide semiconductor, a first oxygen supply pattern disposed on the first active pattern, the first oxygen supply pattern supplying oxygen to the first active pattern, and a second oxygen supply pattern disposed on the second active pattern, the second oxygen supply pattern supplying oxygen to the second active pattern.

In an embodiment, the display device may further include a pixel including a pixel circuit and a light-emitting element electrically connected to the pixel circuit, and a scan driver that supplies a scan signal to the pixel circuit.

In an embodiment, the first transistor and the second transistor may be included in the pixel circuit.

In an embodiment, the second transistor may be electrically connected to the light-emitting element.

In an embodiment, the first transistor and the second transistor may be included in the scan driver.

A method of manufacturing a display device according to an embodiment may include forming a first gate electrode on a substrate, forming a buffer layer on the first gate electrode, forming a first active pattern overlapping the first gate electrode and including an oxide semiconductor, forming a second active pattern spaced apart from the first active pattern and including an oxide semiconductor on the buffer layer, forming a source pattern and a drain pattern respectively at ends of the first active pattern, forming a first insulation pattern on the first active pattern between the source pattern and the drain pattern, forming a second insulation pattern on the second active pattern, forming a first oxygen supply pattern on the first insulation pattern, forming a second oxygen supply pattern on the second insulation pattern, and forming a second gate electrode on the second oxygen supply pattern. The first insulation pattern, the second insulation pattern, the first oxygen supply pattern, the second oxygen supply pattern, and the second gate electrode may be formed by a photolithography process using a first halftone mask.

In an embodiment, the forming of the first insulation pattern, the second insulation pattern, the first oxygen supply pattern, and the second oxygen supply pattern may include sequentially forming an insulation layer and an oxygen supply layer on the first active pattern and the second active pattern, and heat-treating the oxygen supply layer to supply oxygen to the first active pattern and the second active pattern from the oxygen supply layer.

In an embodiment, the first active pattern, the second active pattern, the source pattern, and the drain pattern may be formed by a photolithography process using a second halftone mask.

The display device according to the embodiments may include the first oxygen supply pattern disposed on the first active pattern of the first transistor having the bottom gate structure and the second oxygen supply pattern disposed on the second active pattern of the second transistor having the top gate structure, and the first oxygen supply pattern and the second oxygen supply pattern may supply oxygen to the first active pattern and the second active pattern, respectively. Accordingly, electrical characteristics of the first transistor and the second transistor may be improved.

In the method of manufacturing the display device according to the embodiments, the first oxygen supply pattern, the second oxygen supply pattern, and the second gate electrode may be formed by a (e.g., one) photolithography process using the halftone mask. Accordingly, an additional process for forming the first oxygen supply pattern and the second oxygen supply pattern may not be required, and a manufacturing cost and a manufacturing time of the display device may be reduced.

BRIEF DESCRIPTION OF THE DRAWINGS

Illustrative, non-limiting embodiments will be more clearly understood from the following detailed description taken in conjunction with the accompanying drawings.

FIGS. 5A, 5B, 5C, 5D, 5E, 5F, 5G, 5H, 5I, 5J, and 5K are schematic cross-sectional views illustrating a method of manufacturing a display device according to an embodiment.

FIG. 6 is a schematic cross-sectional view illustrating a pixel according to an embodiment.

DETAILED DESCRIPTION OF THE EMBODIMENTS

Figure 1:
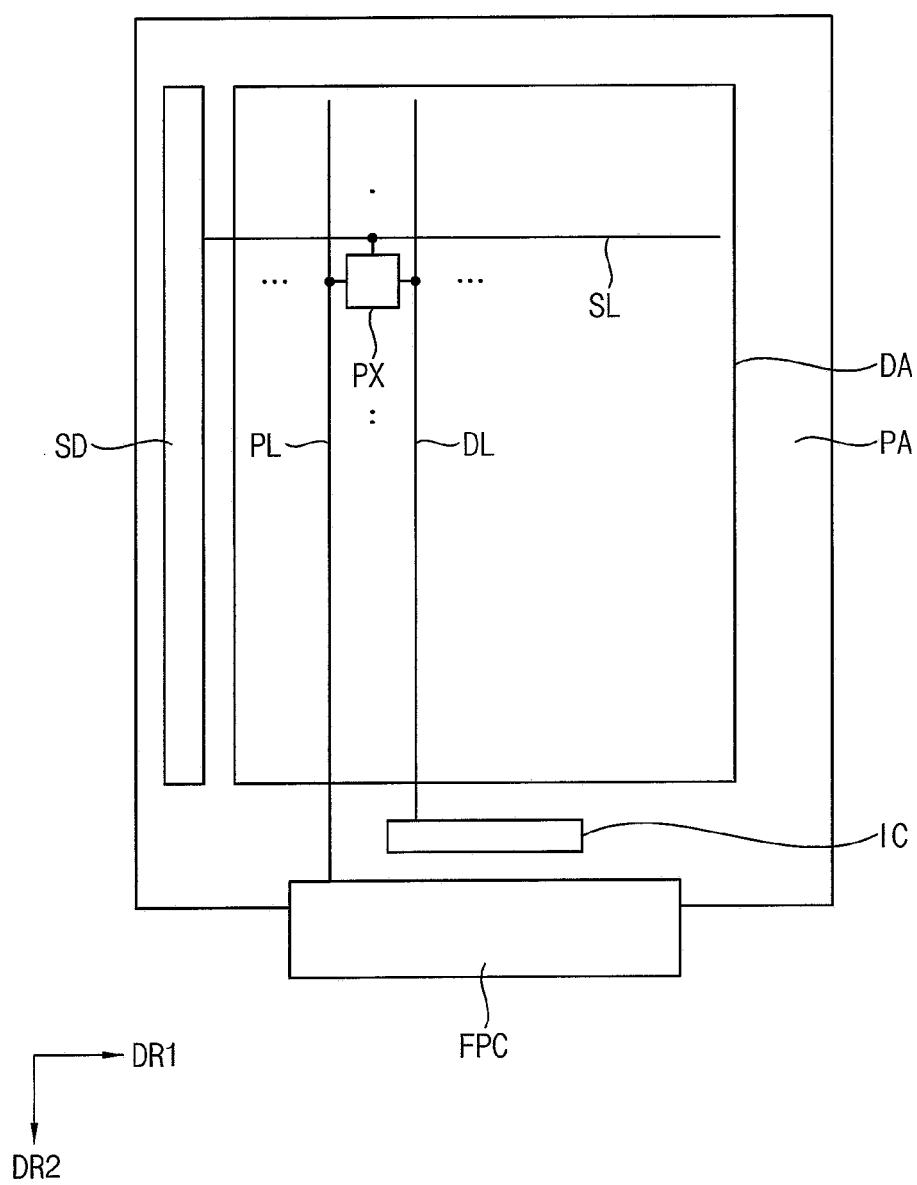
FIG. 1 is a schematic plan view illustrating a display device according to an embodiment.

Hereinafter, display devices and methods of manufacturing display devices in accordance with embodiments will be explained in detail with reference to the accompanying drawings.

Use of the singular form (e.g., "a", "an", "the") may include plural forms as well, unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that although the terms "first," "second," etc. may be used herein to describe various elements, these elements should not be limited by these terms. These components are only used to distinguish one component from another.

Terms such as "comprising", "including" and "having" are intended to indicate the existence of the elements, and are not intended to preclude the possibility that one or more other elements may exist or may be added.

The term "overlap" may include layer, stack, face or facing, extending over, extending under, covering or partly covering or any other suitable term as would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

It will be understood that when a component (e.g., layer, electrode, etc.) is referred to as being "on" another component, it can be directly or indirectly "on" the other component. For example, intervening components may be present. Similarly, when a component is referred to as being connected to another component, it can be directly or indirectly connected to the other component.

"About" or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Although a specific process order may be described, alternative embodiments may employ a different order. For example, two consecutively described processes may be performed substantially at the same time or performed in an order opposite to the described order Unless otherwise defined or implied, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 is a schematic plan view illustrating a display device according to an embodiment.

Referring to FIG. 1, a display device may include pixels PX disposed in a display area DA and a scan driver SD, a driver chip IC, and a flexible printed circuit FPC disposed in a peripheral area PA.

The pixels PX may be arranged along a first direction DR1 and a second direction DR2 crossing the first direction DR1 in the display area DA. Each pixel PX may be electrically connected to a scan line SL, a data line DL, and a driving voltage line PL. The scan line SL may extend in the first direction DR1, and may provide a scan signal to the pixel PX. The data line DL may extend in the second direction DR2, and may provide a data voltage to the pixel PX. The driving voltage line PL may extend parallel to the data line DL, and may provide a driving voltage to the pixel PX. The display area DA may display an image based on light emitted from each of the pixels PX.

The peripheral area PA may be adjacent to the display area DA. In an embodiment, the peripheral area PA may surround the display area DA.

The scan driver SD may be disposed on a first side of the display area DA, and may be electrically connected to the scan line SL. The scan driver SD may provide the scan signal to the pixel PX through the scan line SL. The scan driver SD may include multiple transistors.

The driver chip IC may be disposed on a second side of the display area DA, and may be electrically connected to the data line DL. The driver chip IC may include a data driver that generates the data voltage.

The flexible printed circuit FPC may be disposed on the second side of the display area DA with the driver chip IC disposed therebetween, and may be electrically connected to the driving voltage line PL. The flexible printed circuit FPC may include a power supply that generates the driving voltage. The power supply may provide the driving voltage to the pixel PX through the driving voltage line PL.

Figure 2:
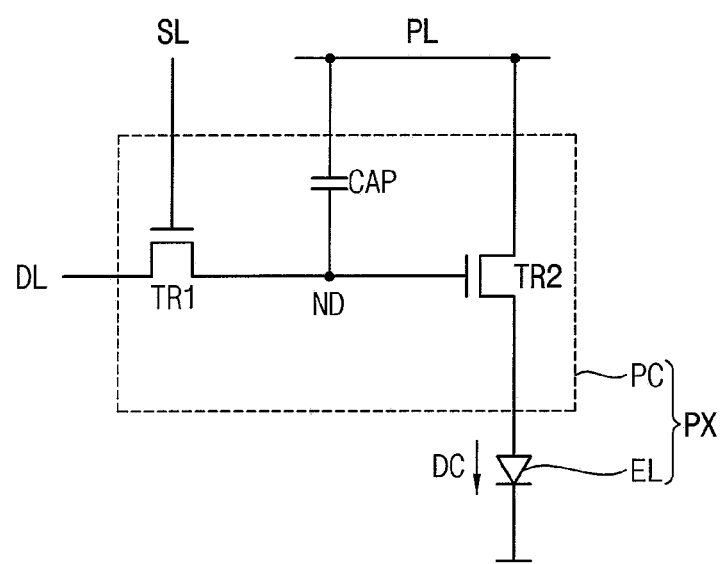
FIG. 2 is a schematic circuit diagram illustrating a pixel according to an embodiment.

FIG. 2 is a schematic circuit diagram illustrating a pixel according to an embodiment.

Referring to FIG. 2, a pixel PX may include a pixel circuit PC and a light-emitting element EL electrically connected to the pixel circuit PC. In an embodiment, the pixel circuit PC may include a first transistor TR1, a second transistor TR2, and a capacitor CAP. However, the invention is not limited thereto, and in another embodiment, the pixel circuit PC may include three or more transistors and/or two or more capacitors.

The first transistor TR1 may be electrically connected to the data line DL and a node ND. The first transistor TR1 may include a first drain electrode receiving the data voltage from the data line DL, a first source electrode electrically connected to the node ND, and a first gate electrode receiving the scan signal from the scan line SL. The first transistor TR1 may transmit the data voltage to the node ND based on the scan signal.

The second transistor TR2 may be electrically connected to the driving voltage line PL and the light-emitting element EL. The second transistor TR2 may include a second drain electrode receiving the driving voltage from the driving voltage line PL, a second source electrode electrically connected to the light-emitting element EL, and a second gate electrode electrically connected to the node ND. The second transistor TR2 may provide a driving current DC to the light-emitting element EL based on a voltage between the second drain electrode and the second gate electrode.

The capacitor CAP may be electrically connected between the driving voltage line PL and the node ND. The capacitor CAP may include a first electrode receiving the driving voltage from the driving voltage line PL and a second electrode electrically connected to the node ND. The capacitor CAP may maintain the voltage between the second drain electrode and the second gate electrode in case that the first transistor TR1 may be turned off.

The light-emitting element EL may be electrically connected between the second transistor TR2 and a common power source. The light-emitting element EL may include a first electrode electrically connected to the second transistor TR2 and a second electrode receiving a common voltage from the common power source. The light-emitting element EL may emit light based on the driving current DC provided from the second transistor TR2.

Figure 3:
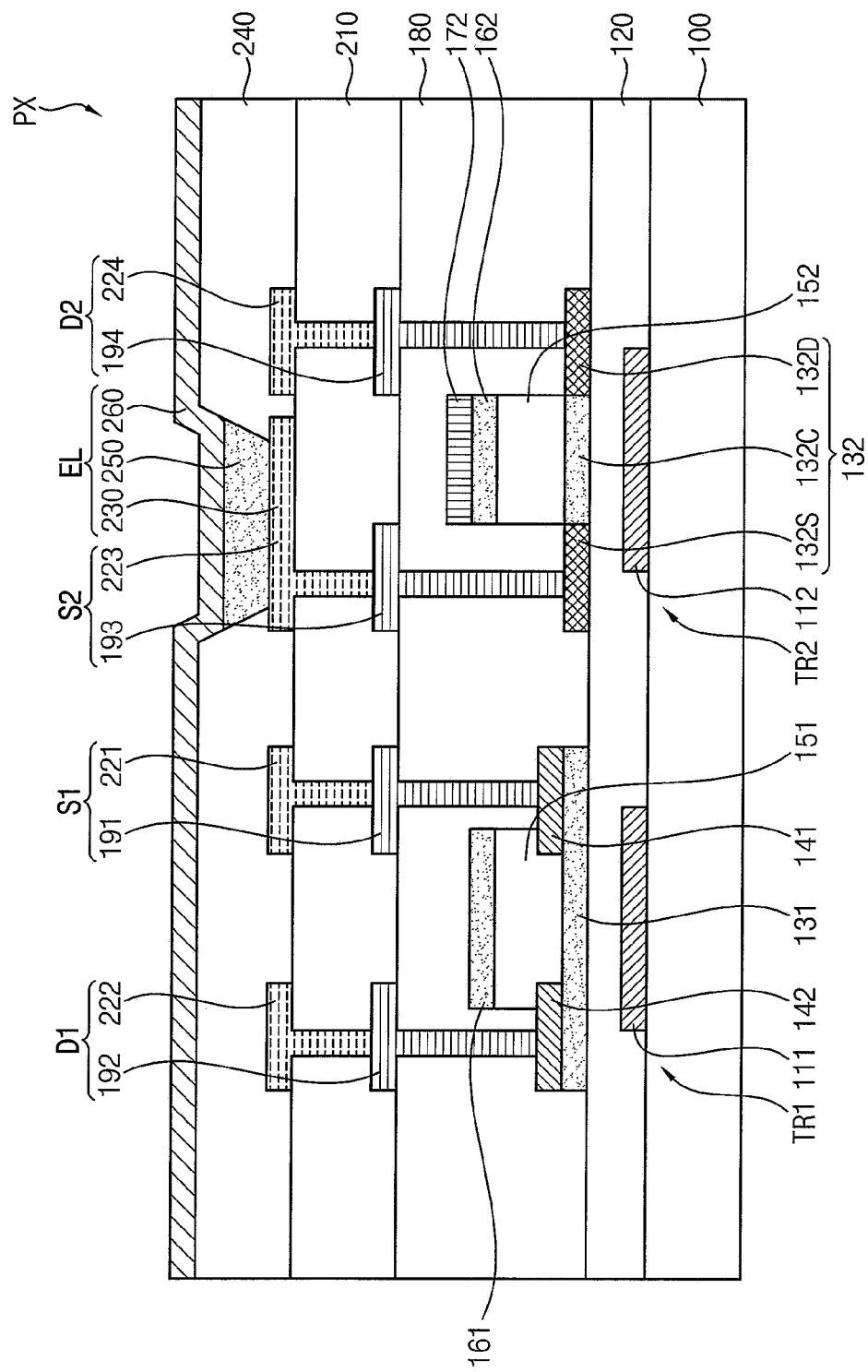
FIG. 3 is a schematic cross-sectional view illustrating a pixel according to an embodiment.

FIG. 3 is a schematic cross-sectional view illustrating a pixel according to an embodiment.

Referring to FIG. 3, a pixel PX may include a first transistor TR1, a second transistor TR2, and a light-emitting element EL disposed on a substrate 100.

The substrate 100 may be a transparent insulating substrate. For example, the substrate 100 may be formed of glass, quartz, plastic, or the like, or a combination thereof.

A first gate electrode 111 and a conductive pattern 112 may be disposed on the substrate 100. The first gate electrode 111 may function as a gate electrode of the first transistor TR1. The conductive pattern 112 may be spaced apart from the first gate electrode 111. The conductive pattern 112 may block external light, impurities, or the like from being flowed into the second transistor TR2 through the substrate 100. The first gate electrode 111 and the conductive pattern 112 may be formed of a conductive material such as molybdenum (Mo), copper (Cu), aluminum (Al), titanium (Ti), or the like, or a combination thereof.

A buffer layer 120 may be disposed on the first gate electrode 111 and the conductive pattern 112. The buffer layer 120 may cover the first gate electrode 111 and the conductive pattern 112 on the substrate 100. The buffer layer 120 may block inflow of impurities through the substrate 100. Further, the buffer layer 120 may provide a planarized surface above the substrate 100. The buffer layer 100 may be formed of an inorganic insulation material such as silicon nitride, silicon oxide, silicon oxynitride, or the like, or a combination thereof.

A first active pattern 131 and a second active pattern 132 may be disposed on the buffer layer 120. The first active pattern 131 may overlap the first gate electrode 111. The second active pattern 132 may be spaced apart from the first active pattern 131, and may overlap the conductive pattern 112. Each of the first active pattern 131 and the second active pattern 132 may be formed of an oxide semiconductor. The oxide semiconductor may include at least one oxide of indium (In), gallium (Ga), zinc (Zn), tin (Sn), titanium (Ti), zirconium (Zr), and hafnium (Hf).

The second active pattern 132 may include a channel region 132C, a source region 132S and a drain region 132D respectively disposed on opposite ends of the channel region 132C. The source region 132S and the drain region 132D may be doped with P-type or N-type impurities, and the channel region 132C may be doped with different type of impurities from those of the source region 132S and the drain region 132D. In an embodiment, the source region 132S and the drain region 132D may be doped with N-type impurities, and the channel region 132C may be doped with P-type impurities.

A source pattern 141 and a drain pattern 142 may be respectively disposed on opposite ends of the first active pattern 131. Each of the source pattern 141 and the drain pattern 142 may be formed of a conductive material such as molybdenum (Mo), copper (Cu), aluminum (Al), titanium (Ti), or the like, or a combination thereof. The first active pattern 131 may function as a channel region of the first transistor TR1, and the source pattern 141 and the drain pattern 142 may function as a source region and a drain region of the first transistor TR1, respectively.

A first insulation pattern 151 may be disposed on the first active pattern 131 between the source pattern 141 and the drain pattern 142. A second insulation pattern 152 may be disposed on the channel region 132C of the second active pattern 132. Each of the first insulation pattern 151 and the second insulation pattern 152 may be formed of an inorganic insulation material such as silicon nitride, silicon oxide, silicon oxynitride, or the like, or a combination thereof.

A first oxygen supply pattern 161 may be disposed on the first insulation pattern 151. A second oxygen supply pattern 162 may be disposed on the second insulation pattern 152. The first oxygen supply pattern 161 may supply oxygen to the first active pattern 131 through the first insulation pattern 151, and the second oxygen supply pattern 162 may supply oxygen to the second active pattern 132 through the second insulation pattern 152. For example, oxygen may be supplied from the first oxygen supply pattern 161 to the first insulation pattern 151 in case that the first oxygen supply pattern 161 may be formed on the first insulation pattern 151, and oxygen may be supplied from the second oxygen supply pattern 162 to the second insulation pattern 152 in case that the second oxygen supply pattern 162 may be formed on the second insulation pattern 152. Oxygen may be supplied from the first insulation pattern 151 and the second insulation pattern 152 to the first active pattern 131 and the second active pattern 132, respectively, in case that the first oxygen supply pattern 161 and the second oxygen supply pattern 162 may be heat-treated.

In case that the first oxygen supply pattern 161 and the second oxygen supply pattern 162 may not be disposed on the first active pattern 131 and the second active pattern 132, respectively, each of the first active pattern 131 and the second active pattern 132 may have an oxygen vacancy. Charge carriers (e.g., holes) in the first active pattern 131 and the second active pattern 132 may increase, so that an initial threshold voltage of each of the first transistor TR1 and the second transistor TR2 may be shifted.

However, in an embodiment according to the disclosure, the first oxygen supply pattern 161 disposed on the first active pattern 131 may supply oxygen to the first active pattern 131 so that the oxygen vacancy of the first active pattern 131 may decrease, and the second oxygen supply pattern 162 disposed on the second active pattern 132 may supply oxygen to the second active pattern 132 so that the oxygen vacancy of the second active pattern 132 may decrease. Therefore, the shift of the initial threshold voltage of each of the first transistor TR1 and the second transistor TR2 may decrease or may be substantially prevented. Accordingly, electrical characteristics of the first transistor TR1 and the second transistor TR2 may be improved.

Each of the first oxygen supply pattern 161 and the second oxygen supply pattern 162 may be formed of an oxide semiconductor. The oxide semiconductor may include at least one oxide of indium (In), gallium (Ga), zinc (Zn), tin (Sn), titanium (Ti), zirconium (Zr), and hafnium (Hf). In an embodiment, each of the first oxygen supply pattern 161, the second oxygen supply pattern 162, the first active pattern 131, and the second active pattern 132 may include a same material. In another embodiment, each of the first oxygen supply pattern 161 and the second oxygen supply pattern 162 may include a different material from the first active pattern 131 and the second active pattern 132.

A second gate electrode 172 may be disposed on the second oxygen supply pattern 162. The second gate electrode 172 may overlap the channel region 132C of the second active pattern 132. The second gate electrode 172 may function as a gate electrode of the second transistor TR2. The second gate electrode 172 may be formed of a conductive material such as molybdenum (Mo), copper (Cu), aluminum (Al), titanium (Ti), or the like, or a combination thereof.

In an embodiment, the second gate electrode 172 may be electrically connected to the conductive pattern 112. The second gate electrode 172 may function as an upper gate electrode of the second transistor TR2, and the conductive pattern 112 may function as a lower gate electrode of the second transistor TR2. Accordingly, the second transistor TR2 may have a dual gate structure, and the second transistor TR2 may have a relatively high electron mobility.

The first gate electrode 111, the first active pattern 131, the source pattern 141, and the drain pattern 142 may form the first transistor TR1. The first transistor TR1 may have a bottom gate structure in which the first gate electrode 111 may be disposed under the first active pattern 131.

The second active pattern 132 including the channel region 132C, the source region 132S and the drain region 132D, and the second gate electrode 172 may form the second transistor TR2. The second transistor TR2 may have a top gate structure in which the second gate electrode 172 may be disposed over the second active pattern 132.

It is not illustrated in FIG. 3, however, each of the first electrode and the second electrode of the capacitor CAP in FIG. 2 and at least one of the first gate electrode 111, the first active pattern 131, the source pattern 141, the first oxygen supply pattern 161, and the second gate electrode 172 may be disposed on a same layer. For example, the first electrode of the capacitor CAP and the source pattern 141 may be disposed on a same layer, and the second electrode of the capacitor CAP and the second gate electrode 172 may be disposed on a same layer.

An insulation interlayer 180 may be disposed on the first oxygen supply pattern 161 and the second gate electrode 172. The insulation interlayer 180 may cover the first oxygen supply pattern 161, the second gate electrode 172, the source pattern 141, the drain pattern 142, and the second active pattern 132 on the buffer layer 120. The insulation interlayer 180 may be formed of an inorganic insulation material such as silicon nitride, silicon oxide, silicon oxynitride, or the like, or a combination thereof.

A first source electrode S1, a first drain electrode D1, a second source electrode S2, and a second drain electrode D2, may be disposed on the insulation inter layer 180. The first source electrode S1 may be electrically connected to the source pattern 141, and the first drain electrode D1 may be electrically connected to the drain pattern 142. The second source electrode S2 may be electrically connected to the source region 132S, and the second drain electrode D2 may be electrically connected to the drain region 132D.

In an embodiment, the second source electrode S2 may be electrically connected to the conductive pattern 112. An output saturation characteristics of the second transistor TR2 may be improved, and a driving range of the second transistor TR2 may increase.

In an embodiment, the first source electrode S1 may include a first lower source electrode 191 and a first upper source electrode 221, the first drain electrode D1 may include a first lower drain electrode 192 and a first upper drain electrode 222. Further, the second source electrode S2 may include a second lower source electrode 193 and a second upper source electrode 223, the second drain electrode D2 may include a second lower drain electrode 194 and a second upper drain electrode 224.

The first lower source electrode 191, the first lower drain electrode 192, the second lower source electrode 193, and the second lower drain electrode 194 may be disposed on an upper surface of the insulation interlayer 180. The first lower source electrode 191 may be electrically connected to the source pattern 141 through a contact hole formed in the insulation interlayer 180, and the first lower drain electrode 192 may be electrically connected to the drain pattern 142 through a contact hole formed in the insulation interlayer 180. The second lower source electrode 193 may be electrically connected to the source region 132S through a contact hole formed in the insulation interlayer 180, and the second lower drain electrode 194 may be electrically connected to the drain region 132D through a contact hole formed in the insulation interlayer 180. The first lower source electrode 191, the first lower drain electrode 192, the second lower source electrode 193, and the second lower drain electrode 194 may be formed of a conductive material such as molybdenum (Mo), copper (Cu), aluminum (Al), titanium (Ti), or the like, or a combination thereof.

A planarization layer 210 may be formed on the first lower source electrode 191, the first lower drain electrode 192, the second lower source electrode 193, and the second lower drain electrode 194. The planarization layer 210 may cover the first lower source electrode 191, the first lower drain electrode 192, the second lower source electrode 193, and the second lower drain electrode 194 on the insulation interlayer 180. The planarization layer 210 may be formed of an organic insulation material such as polyimide (PI) or the like.

The first upper source electrode 221, the first upper drain electrode 222, the second upper source electrode 223, and the second upper drain electrode 224 may be disposed on an upper surface of the planarization layer 210. The first upper source electrode 221 may be electrically connected to the first lower source electrode 191 through a contact hole formed in the planarization layer 210, and the first upper drain electrode 222 may be electrically connected to the first lower drain electrode 192 through a contact hole formed in the planarization layer 210. The second upper source electrode 223 may be electrically connected to the second lower source electrode 193 through a contact hole formed in the planarization layer 210, and the second upper drain electrode 224 may be electrically connected to the second lower drain electrode 194 through a contact hole formed in the planarization layer 210. The first upper source electrode 221, the first upper drain electrode 222, the second upper source electrode 223, and the second upper drain electrode 224 may be formed of a conductive material such as metal, alloy, transparent conductive oxide, or the like, or a combination thereof. For example, the conductive material may include silver (Ag), indium tin oxide (ITO), or the like, or a combination thereof.

A first electrode 230 may be disposed on the planarization layer 210. The second upper source electrode 223 may extend to form the first electrode 230. In other words, the first electrode 230 and the second upper source electrode 223 may be integrally formed. Accordingly, the first electrode 230 may be electrically connected to the second transistor TR2.

Reliability of the second transistor TR2 against positive bias stress may be important because the second transistor TR2 consistently supplies the driving current to the light-emitting element EL. Compared to the first transistor TR1 having the bottom gate structure, the second transistor TR2 having the top gate structure may have excellent reliability against the positive bias stress, therefore, it may be appropriate that the first electrode 230 may be electrically connected to the second transistor TR2 rather than the first transistor TR1.

A pixel defining layer 240 may be disposed on the first upper source electrode 221, the first upper drain electrode 222, the second upper source electrode 223, the second upper drain electrode 224, and the first electrode 230. The pixel defining layer 240 may cover the first upper source electrode 221, the first upper drain electrode 222, the second upper source electrode 223, the second upper drain electrode 224, and the first electrode 230 on the planarization layer 210. The pixel defining layer 240 may have a pixel opening exposing at least a portion of the first electrode 230. In an embodiment, the pixel opening may expose a central portion of the first electrode 230, and the pixel defining layer 240 may cover a peripheral portion of the first electrode 230. The pixel defining layer 240 may be formed of an organic insulation material such as polyimide (PI) or the like.

An emission layer 250 may be disposed on the first electrode 230. The emission layer 250 may be disposed on the first electrode 230 exposed by the pixel opening. The emission layer 250 may be formed of at least one of an organic light emitting material and a quantum dot.

In an embodiment, the organic light emitting material may include a low molecular organic compound, a high molecular organic compound, or a combination thereof. For example, the low molecular organic compound may include copper phthalocyanine, diphenylbenzidine (N, N'-diphenyl-benzidine), trihydroxyquinoline aluminum (tris-(8-hydroxy-quinoline)aluminum), and the like, or a combination thereof. The high molecular organic compound may include poly ethylenedioxythiophene (poly(3,4-ethylenedioxythio-phene), polyaniline, polyphenylenevinylene, polyfluorene, and the like, or a combination thereof.

In an embodiment, the quantum dot may include a core including a group II-VI compound, a group III-V compound, a group IV-VI compound, a group IV element, a group IV compound, and a combination thereof. In one embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

A second electrode 260 may be disposed on the emission layer 250. In an embodiment, the second electrode 260 may also be disposed on the pixel defining layer 240. The second electrode 260 may be formed of a conductive material such as metal, alloy, transparent conductive oxide, or the like, or a combination thereof. For example, the conductive material may include aluminum (Al), platinum (Pt), silver (Ag), magnesium (Mg), gold (Au), chromium (Cr), tungsten (W), titanium (Ti), or the like, or a combination thereof. The first electrode 230, the emission layer 250, and the second electrode 260 may form the light-emitting element EL.

Figure 4:
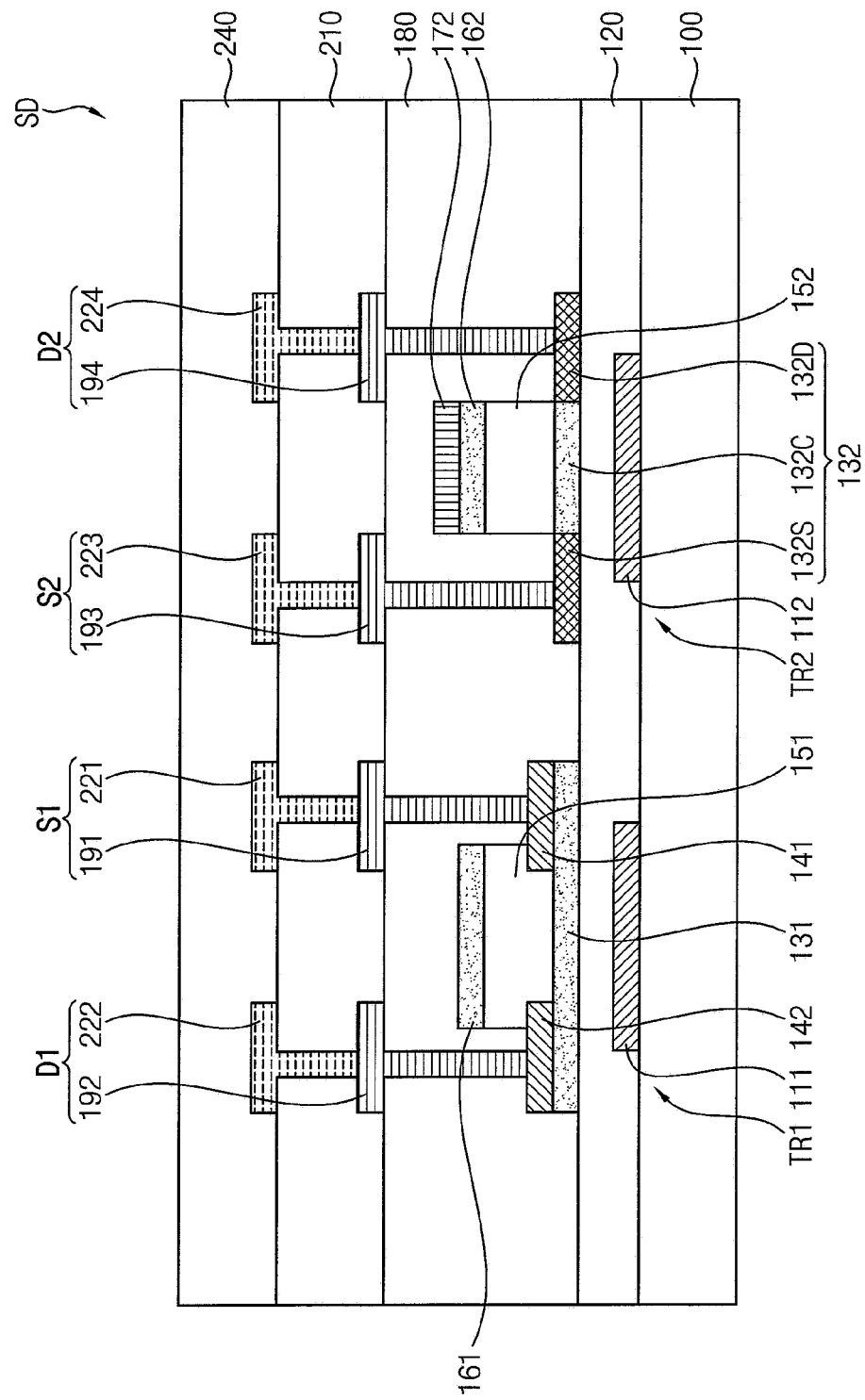
FIG. 4 is a schematic cross-sectional view illustrating a scan driver according to an embodiment.

FIG. 4 is a schematic cross-sectional view illustrating a scan driver according to an embodiment.

Referring to FIG. 4, a scan driver SD may include a first transistor TR1 and a second transistor TR2 disposed on a substrate 100. The scan driver SD described with reference to FIG. 4 may be substantially the same as or similar to the pixel PX described with reference to FIG. 3 except that the pixel defining layer 240 may not have the pixel opening and the scan driver SD may not include the light-emitting element EL. Accordingly, descriptions regarding repeated elements will be omitted.

FIGS. 5A, 5B, 5C, 5D, 5E, 5F, 5G, 5H, 5I, 5J, and 5K are schematic cross-sectional views illustrating a method of manufacturing a display device according to an embodiment.

Figure 5A:
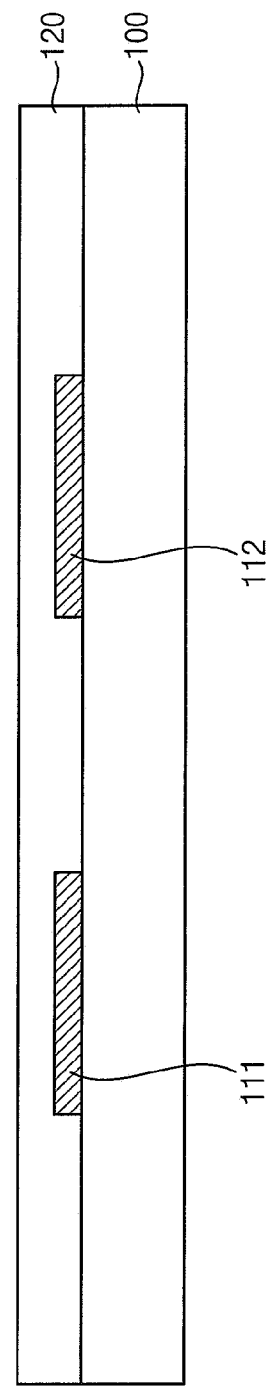

Referring to FIG. 5A, a first gate electrode 111 and a conductive pattern 112 may be formed on a substrate 100, and a buffer layer 120 may be formed on the first gate electrode 111 and the conductive pattern 112.

First, a conductive layer may be formed on the substrate 100, and the conductive layer may be etched to form the first gate electrode 111 and the conductive pattern 112. The buffer layer 120 covering the first gate electrode 111 and the conductive pattern 112 may be formed on the substrate 100.

Figure 5B:
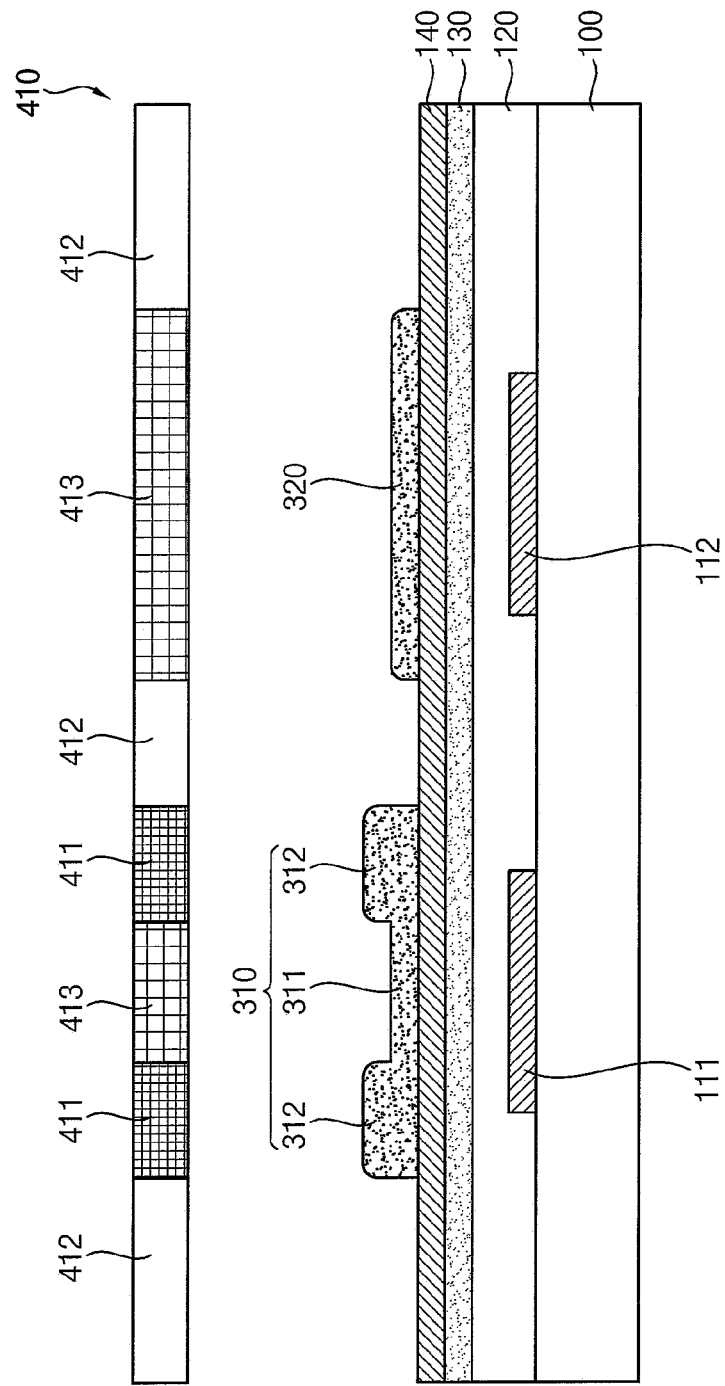
Figure 5C:
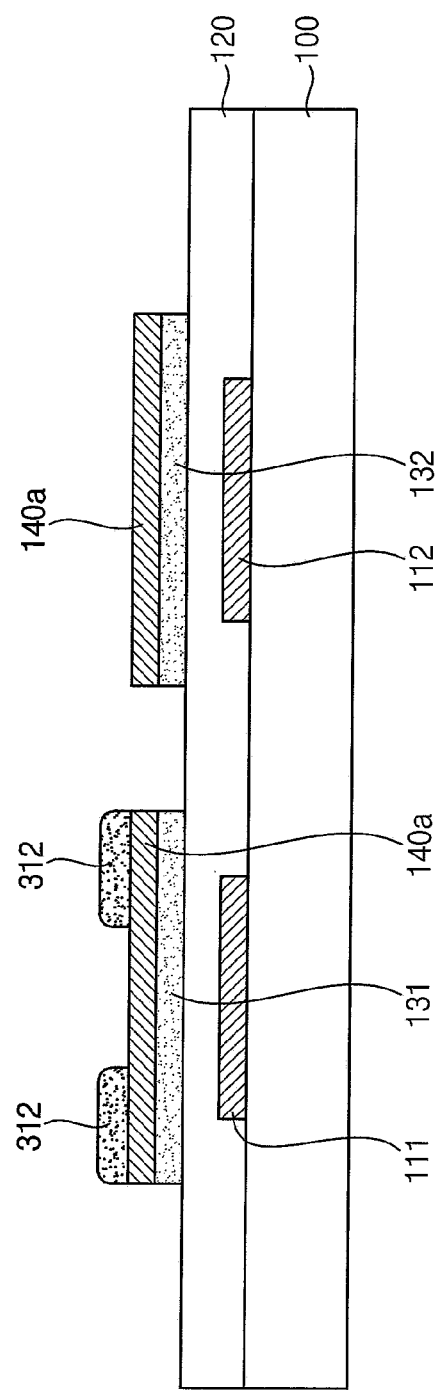
Figure 5D:
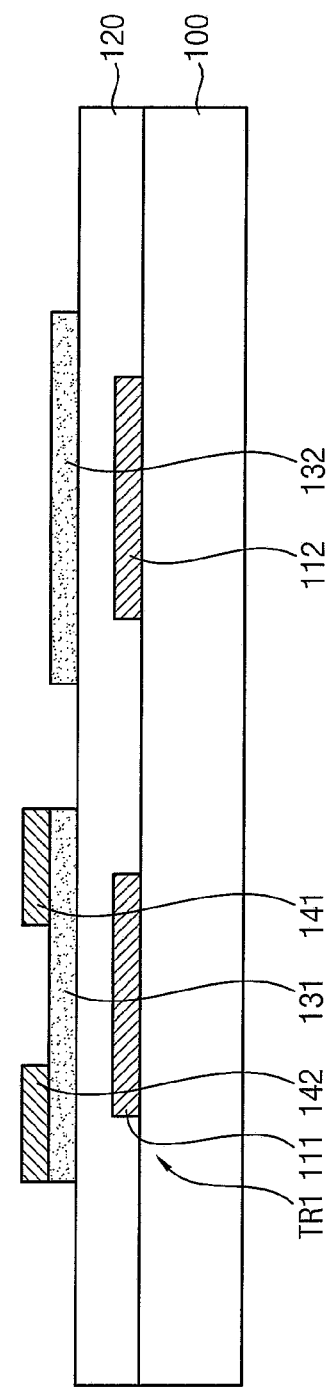
Figure 5E:
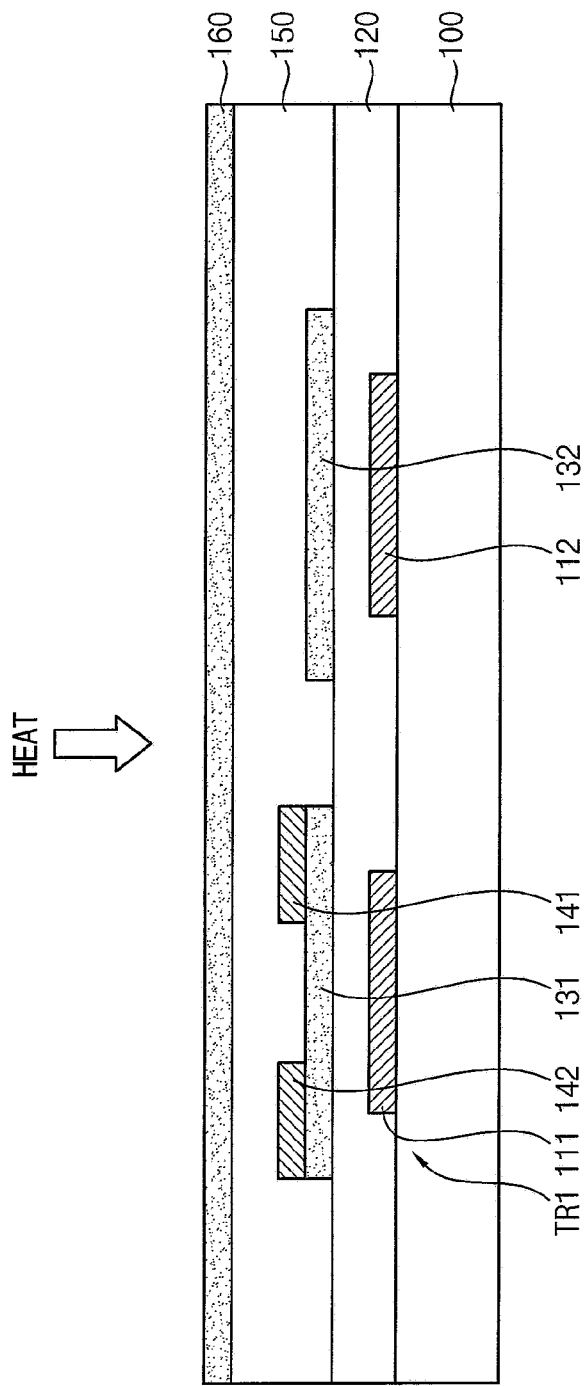
Figure 5F:
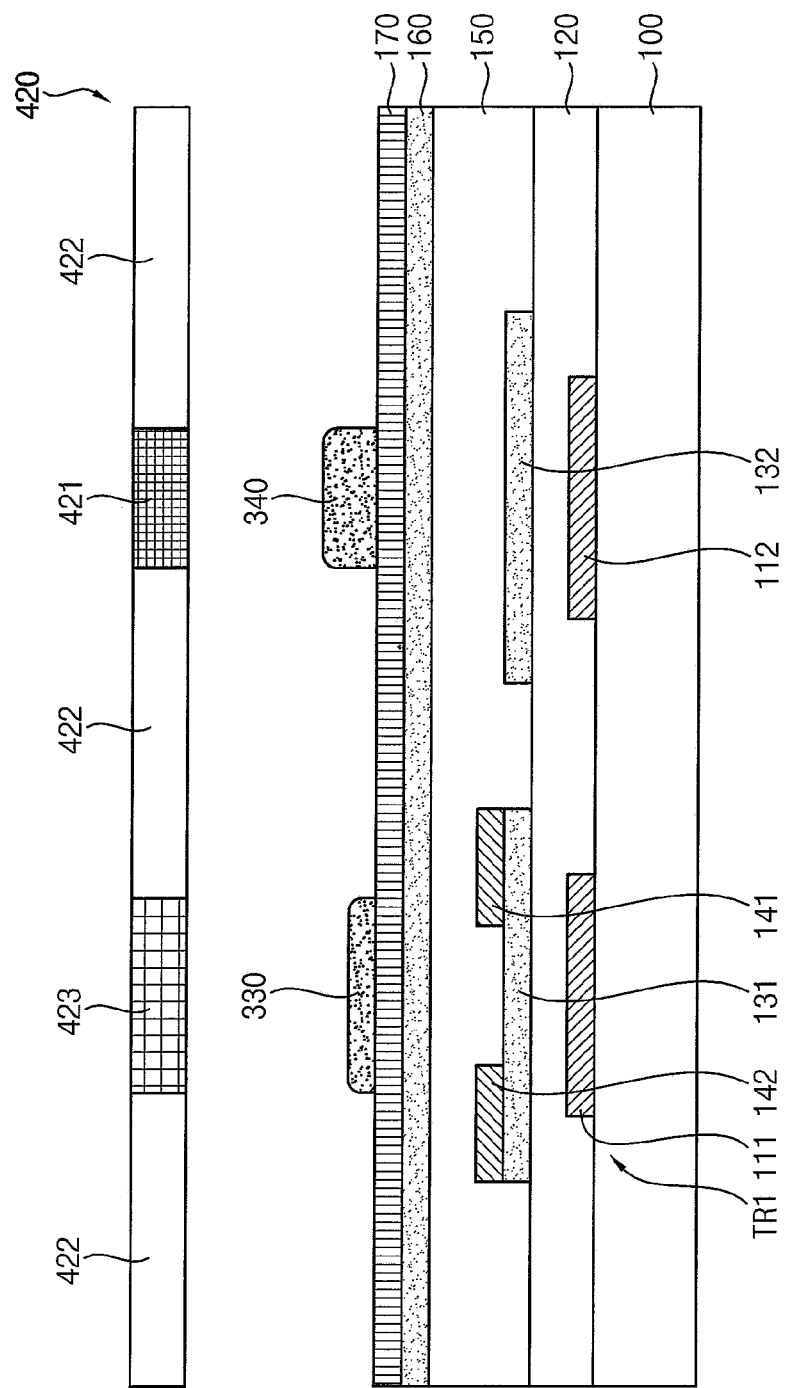
Figure 5H:
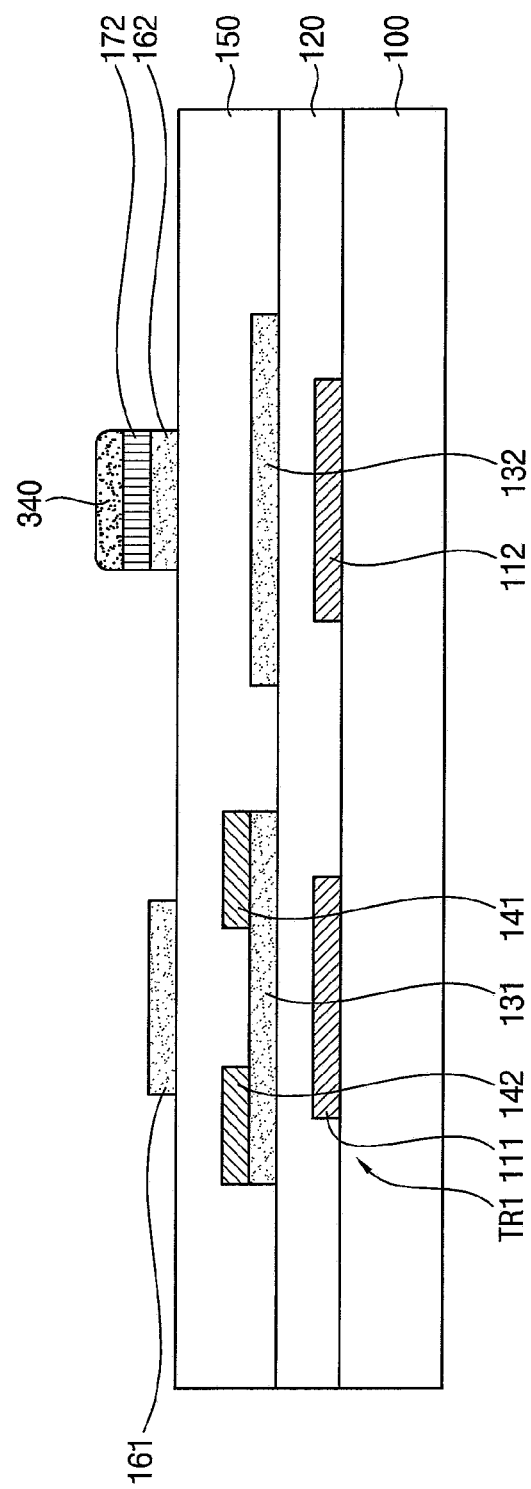
Figure 5I:
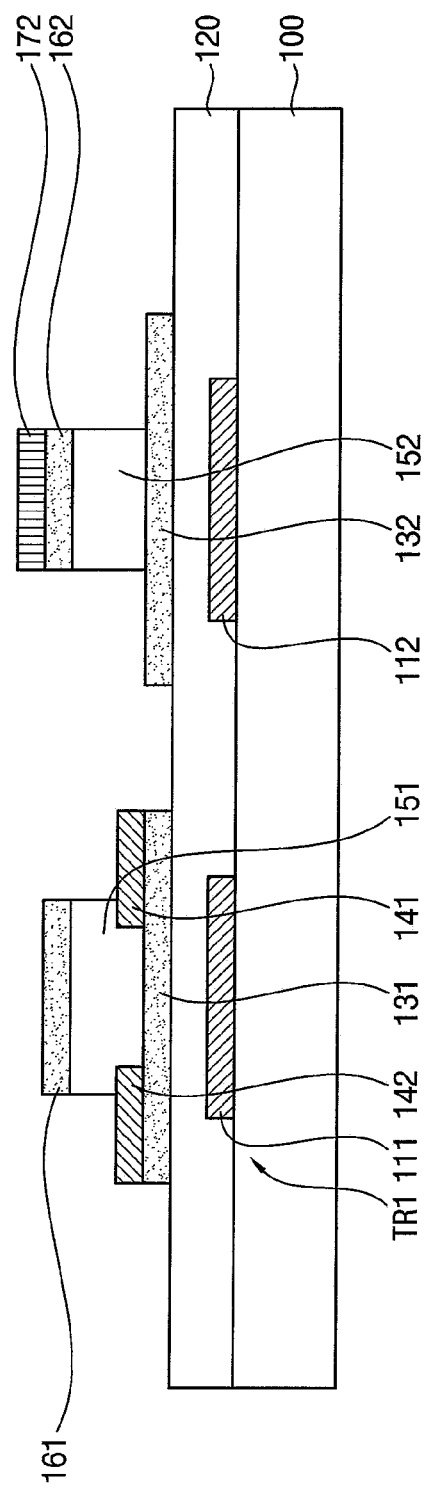

Referring to FIGS. 5B, 5C, and 5D, a first active pattern 131, a second active pattern 132, a source pattern 141, and a drain pattern 142 may be formed on the buffer layer 120.

In an embodiment, the first active pattern 131, the second active pattern 132, the source pattern 141, and the drain pattern 142 may be formed by one photolithography process using a first halftone mask 410.

First, a semiconductor layer 130 and a conductive layer 140 may be sequentially formed on the buffer layer 120. A photoresist layer may be formed on the conductive layer 140, and the photoresist layer may be patterned using the first halftone mask 410 to form a first photoresist pattern 310 and a second photoresist pattern 320.

The first halftone mask 410 may include a light-blocking portion 411, a light-transmitting portion 412, and a semi-transmitting portion 413. The light-blocking portion 411 may block most of external light, and the light-transmitting portion 412 may transmit most of the external light. The semi-transmitting portion 413 may have a transmittance greater than a transmittance of the light-blocking portion 411 and less than a transmittance of the light-transmitting portion 412. The light-blocking portion 411 may be positioned to correspond to the source pattern 141 and the drain pattern 142, and the semi-transmitting portion 413 may be positioned to correspond to a portion of the first active pattern 131 between the source pattern 141 and the drain pattern 142, and the second active pattern 132.

The photoresist layer may be exposed and developed using the first halftone mask 410 so that the first photoresist pattern 310 and the second photoresist pattern 320 may be formed. The first photoresist pattern 310 may include a first portion 311 and second portions 312 respectively protruding from opposite ends of the first portion 311, and the second photoresist pattern 320 and the first portion 311 may have a substantially same thickness.

The semiconductor layer 130 and the conductive layer 140 may be etched using the first photoresist pattern 310 and the second photoresist pattern 320 as an etch mask to form the first active pattern 131, the second active pattern 132, and a conductive pattern 140a. The first photoresist pattern 310 and the second photoresist pattern 320 may be ashed such that the second portions 312 of the first photoresist pattern 310 may remain, and the second photoresist pattern 320 may be removed. The conductive pattern 140a may be etched using the second portion 312 of the first photoresist pattern 310 as an etch mask to form the source pattern 141 and the drain pattern 142. Accordingly, the first active pattern 131, the second active pattern 132, the source pattern 141, and the drain pattern 142 may be formed by one photolithography process.

Referring to FIGS. 5E, 5F, 5G, 5H, and 5I, a first insulation pattern 151 and a first oxygen supply pattern 161 may be formed on the first active pattern 131 between the source pattern 141 and the drain pattern 142, and a second insulation pattern 152, a second oxygen supply pattern 162, and a second gate electrode 172 may be formed on the second active pattern 132.

The first insulation pattern 151, the second insulation pattern 152, the first oxygen supply pattern 161, the second oxygen supply pattern 162, and the second gate electrode 172 may be formed by one photolithography process using a second halftone mask 420.

First, an insulation layer 150 covering the first active pattern 131, the second active pattern 132, the source pattern 141, and the drain pattern 142 may be formed on the buffer layer 120, and an oxygen supply layer 160 may be formed on the insulation layer 150. Oxygen may be supplied from the oxygen supply layer 160 to the insulation layer 150 in the process of forming the oxygen supply layer 160 on the insulation layer 150.

The oxygen supply layer 160 may be heat-treated to supply oxygen to the first active pattern 131 and the second active pattern 132. Each of the first active pattern 131 and the second active pattern 132 may include an oxygen vacancy. Oxygen may be supplied to the first active pattern 131 and the second active pattern 132 from the insulation layer 150 by heat-treating the oxygen supply layer 160, so that the oxygen vacancy of each of the first active pattern 131 and the second active pattern 132 may decrease.

A conductive layer 170 may be formed on the oxygen supply layer 160. A photoresist layer may be formed on the conductive layer 170, and the photoresist layer may be patterned using the second halftone mask 420 to form a third photoresist pattern 330 and a fourth photoresist pattern 340.

The second halftone mask 420 may include a light-blocking portion 421, a light-transmitting portion 422, and a semi-transmitting portion 423. The light-blocking portion 421 may block most of external light, and the light-transmitting portion 422 may transmit most of the external light. The semi-transmitting portion 423 may have a transmittance greater than a transmittance of the light-blocking portion 421 and less than a transmittance of the light-transmitting portion 422. The light-blocking portion 421 may be positioned to correspond to the second insulation pattern 152, the second oxygen supply pattern 162 and the second gate electrode 172, and the semi-transmitting portion 423 may be positioned to correspond to the first insulation pattern 151 and the first oxygen supply pattern 161.

The photoresist layer may be exposed and developed using the second halftone mask 420 so that the third photoresist pattern 330 and the fourth photoresist pattern 340 may be formed. The fourth photoresist pattern 340 may have a thickness greater than a thickness of the third photoresist pattern 330.

The oxygen supply layer 160 and the conductive layer 170 may be etched using the third photoresist pattern 330 and the fourth photoresist pattern 340 as an etch mask to form the first oxygen supply pattern 161, the second oxygen supply pattern 162, a conductive pattern 171, and the second gate electrode 172. The third photoresist pattern 330 and the fourth photoresist pattern 340 may be ashed such that the fourth photoresist pattern 340 may remain, and the third photoresist pattern 330 may be removed. The conductive pattern 171 may be etched using the fourth photoresist pattern 340 as an etch mask to remove the conductive pattern 171. The insulation layer 150 may be etched using the first oxygen supply pattern 161 and the fourth photoresist pattern 340 as an etch mask to form the first insulation pattern 151 and the second insulation pattern 152. Accordingly, the first insulation pattern 151, the second insulation pattern 152, the first oxygen supply pattern 161, the second oxygen supply pattern 162, and the second gate electrode 172 may be formed by one photolithography process.

Figure 5J:
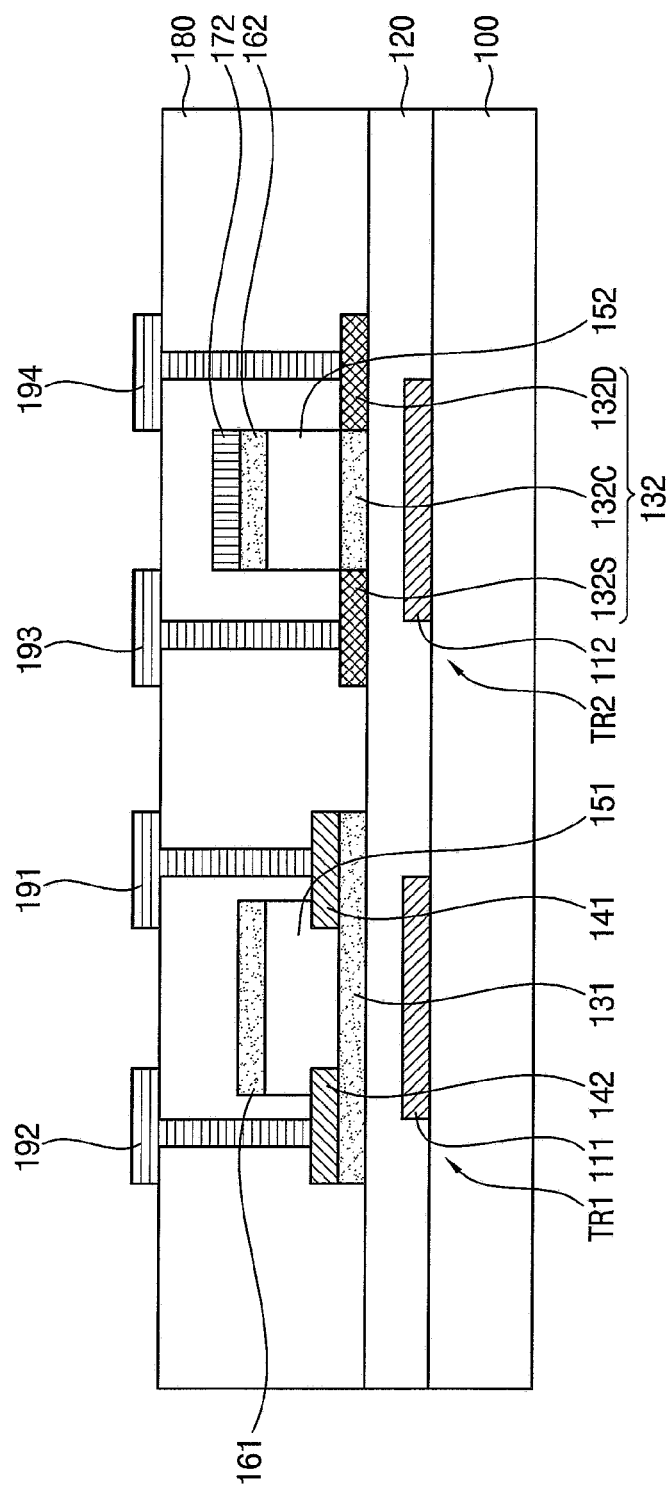

Referring to FIG. 5J, an insulation interlayer 180 may be formed on the first oxygen supply pattern 161 and the second gate electrode 172, and a first lower source electrode 191, a first lower drain electrode 192, a second lower source electrode 193, and a second lower drain electrode 194 may be formed on the insulation interlayer 180.

First, the insulation interlayer 180 covering (e.g., overlapping) the first oxygen supply pattern 161, the second gate electrode 172, the source pattern 141, the drain pattern 142, and the second active pattern 132 may be formed on the buffer layer 120. Impurities may be injected to opposite ends of the second active pattern 132 by a contact between the insulation interlayer 180 and the second active pattern 132, so that a source region 132S and a drain region 132D may be formed.

Contact holes respectively exposing the source pattern 141, the drain pattern 142, the source region 132S, and the drain region 132D may be formed in the insulation interlayer 180. A conductive layer filling the contact holes may be formed on the insulation interlayer 180, and the conductive layer may be etched to form the first lower source electrode 191, the first lower drain electrode 192, the second lower source electrode 193, and the second lower drain electrode 194.

Referring to FIG. 5K, a planarization layer 210 may be formed on the first lower source electrode 191, the first lower drain electrode 192, the second lower source electrode 193, and the second lower drain electrode 194, and a first upper source electrode 221, a first upper drain electrode 222, a second upper source electrode 223, and a second upper drain electrode 224 may be formed on the planarization layer 210.

First, the planarization layer 210 covering the first lower source electrode 191, the first lower drain electrode 192, the second lower source electrode 193, and the second lower drain electrode 194 may be formed on the insulation interlayer 180. Contact holes respectively exposing the first lower source electrode 191, the first lower drain electrode 192, the second lower source electrode 193, and the second lower drain electrode 194 may be formed in the planarization layer 210. A conductive layer filling the contact holes may be formed on the planarization layer 210, and the conductive layer may be etched to form the first upper source electrode 221, the first upper drain electrode 222, the second upper source electrode 223, and the second upper drain electrode 224.

FIG. 6 is a schematic cross-sectional view illustrating a pixel according to an embodiment.

The pixel PX described with reference to FIG. 6 may be substantially the same as or similar to the pixel PX described with reference to FIG. 3 except that the pixel PX may further include a protective layer 200. Accordingly, descriptions regarding repeated elements will be omitted.

Referring to FIG. 6, in an embodiment, a protective layer 200 may be disposed between the insulation interlayer 180 and the planarization layer 210. The protective layer 200 may cover (e.g., overlap) the first lower source electrode 191, the first lower drain electrode 192, the second lower source electrode 193, and the second lower drain electrode 194 on the insulation interlayer 180. The protective layer 200 may be formed of an inorganic insulation material such as silicon nitride, silicon oxide, silicon oxynitride, or the like, or a combination thereof. In case that the planarization layer 210 formed of an organic insulation material may be disposed on (e.g., directly on) the first lower source electrode 191, the first lower drain electrode 192, the second lower source electrode 193, and the second lower drain electrode 194 (in other words, in case that the planarization layer 210 contacts the first lower source electrode 191, the first lower drain electrode 192, the second lower source electrode 193, and the second lower drain electrode 194), the first lower source electrode 191, the first lower drain electrode 192, the second lower source electrode 193, and the second lower drain electrode 194 may be chemically reacted to the planarization layer 210 and may be corroded. However, according to an embodiment of the disclosure, the protective layer 200 covering the first lower source electrode 191, the first lower drain electrode 192, the second lower source electrode 193, and the second lower drain electrode 194 may be disposed between the insulation interlayer 180 and the planarization layer 210. Accordingly, the first lower source electrode 191, the first lower drain electrode 192, the second lower source electrode 193, and the second lower drain electrode 194 may not be corroded.

Figure 7:
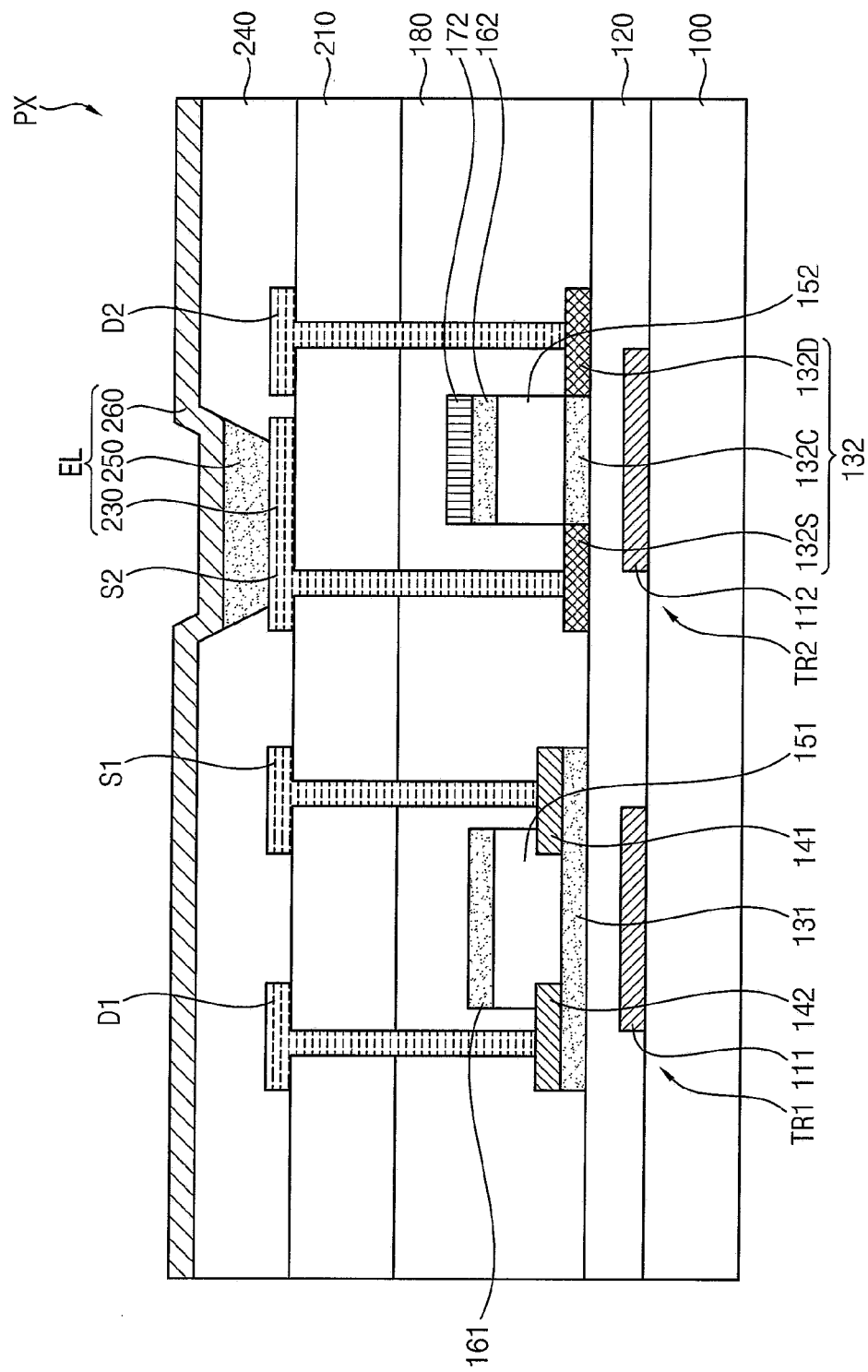
FIG. 7 is a schematic cross-sectional view illustrating a pixel according to an embodiment.

FIG. 7 is a schematic cross-sectional view illustrating a pixel according to an embodiment.

The pixel PX described with reference to FIG. 7 may be substantially the same as or similar to the pixel PX described with reference to FIG. 3 except for structures of the first source electrode S1, the first drain electrode D1, the second source electrode S2, and the second drain electrode D2. Accordingly, descriptions regarding repeated elements will be omitted.

Referring to FIG. 7, in an embodiment, the first source electrode S1, the first drain electrode D1, the second source electrode S2, and the second drain electrode D2 may be disposed on an upper surface of the planarization layer 210. The first source electrode S1 may be electrically connected to the source pattern 141 through a contact hole formed in the insulation interlayer 180 and the planarization layer 210, and the first drain electrode D1 may be electrically connected to the drain pattern 142 through a contact hole formed in the insulation interlayer 180 and the planarization layer 210. The second source electrode S2 may be electrically connected to the source region 132S through a contact hole formed in the insulation interlayer 180 and the planarization layer 210, and the second drain electrode D2 may be electrically connected to the drain region 132D through a contact hole formed in the insulation interlayer 180 and the planarization layer 210. The first source electrode S1, the first drain electrode D1, the second source electrode S2, and the second drain electrode D2 may be formed of a conductive material such as metal, alloy, transparent conductive oxide, or the like, or a combination thereof. For example, the conductive material may include silver (Ag), indium tin oxide (ITO), or the like, or a combination thereof.

The first electrode 230 may be disposed on the planarization layer 210. The second source electrode S2 may extend to form the first electrode 230. In other words, the first electrode 230 and the second source electrode S2 may be integrally formed.

Figure 8:
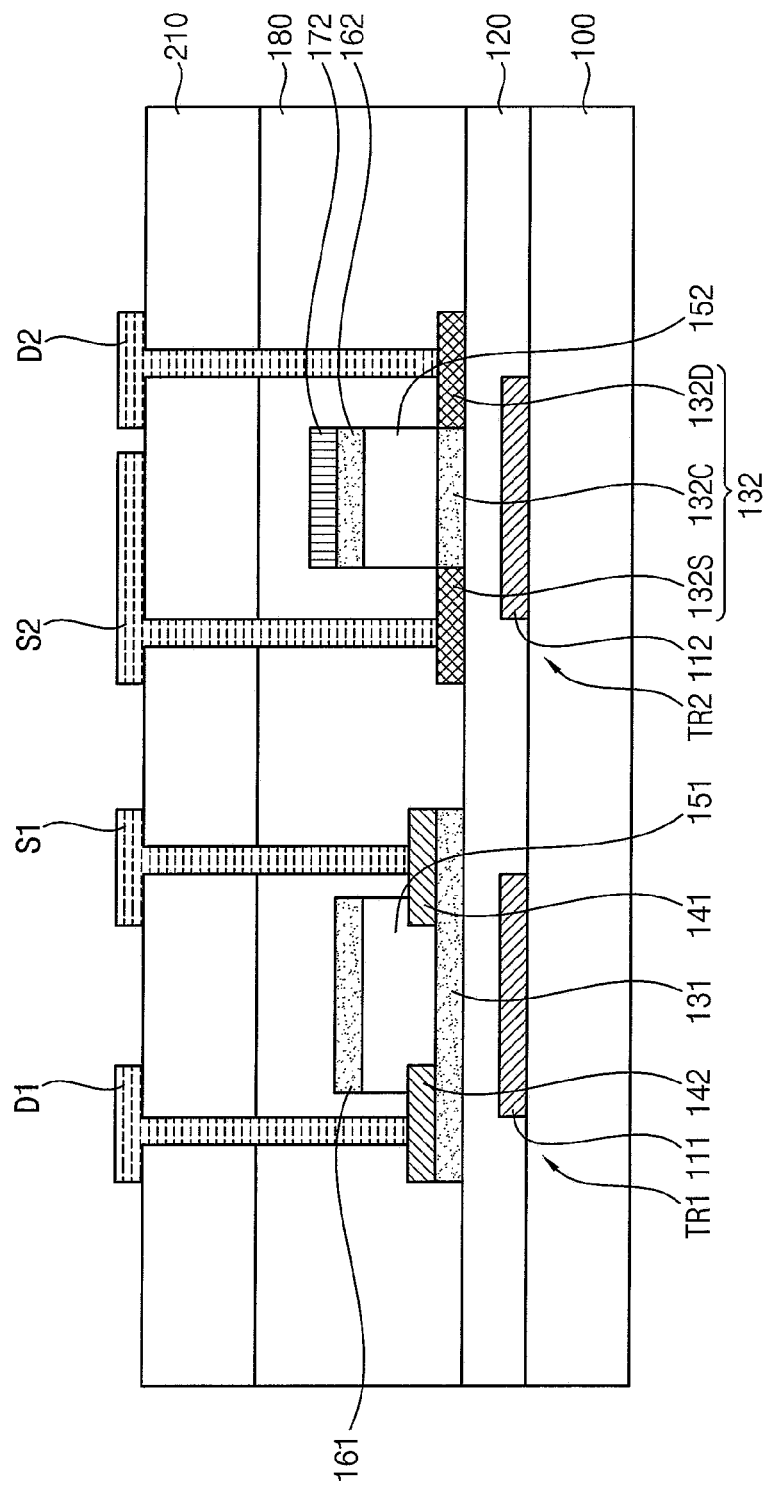
FIG. 8 is a schematic cross-sectional view illustrating a method of manufacturing a display device according to an embodiment.

FIG. 8 is a schematic cross-sectional view illustrating a method of manufacturing a display device according to an embodiment.

The method of manufacturing the display device described with reference to FIGS. 5A to 5I and 8 may be substantially the same as or similar to the method of manufacturing the display device described with reference to FIGS. 5A to 5K except for the formation of the first source electrode S1, the first drain electrode D1, the second source electrode S2, and the second drain electrode D2. Accordingly, descriptions regarding repeated elements will be omitted.

Referring to FIG. 8, the insulation interlayer 180 and the planarization layer 210 may be formed on the first oxygen supply pattern 161 and the second gate electrode 172, and the first source electrode S1, the first drain electrode D1, the second source electrode S2, and the second drain electrode D2 may be formed on the planarization layer 210.

First, the insulation interlayer 180 covering the first oxygen supply pattern 161, the second gate electrode 172, the source pattern 141, the drain pattern 142, and the second active pattern 132 may be formed on the buffer layer 120. The planarization layer 210 may be formed on the insulation interlayer 180.

Contact holes respectively exposing the source pattern 141, the drain pattern 142, the source region 132S, and the drain region 132D may be formed in the insulation interlayer 180 and the planarization layer 210. A conductive layer filling the contact holes may be formed on the planarization layer 210, and the conductive layer may be etched to form the first source electrode S1, the first drain electrode D1, the second source electrode S2, and the second drain electrode D2.

Figure 9:
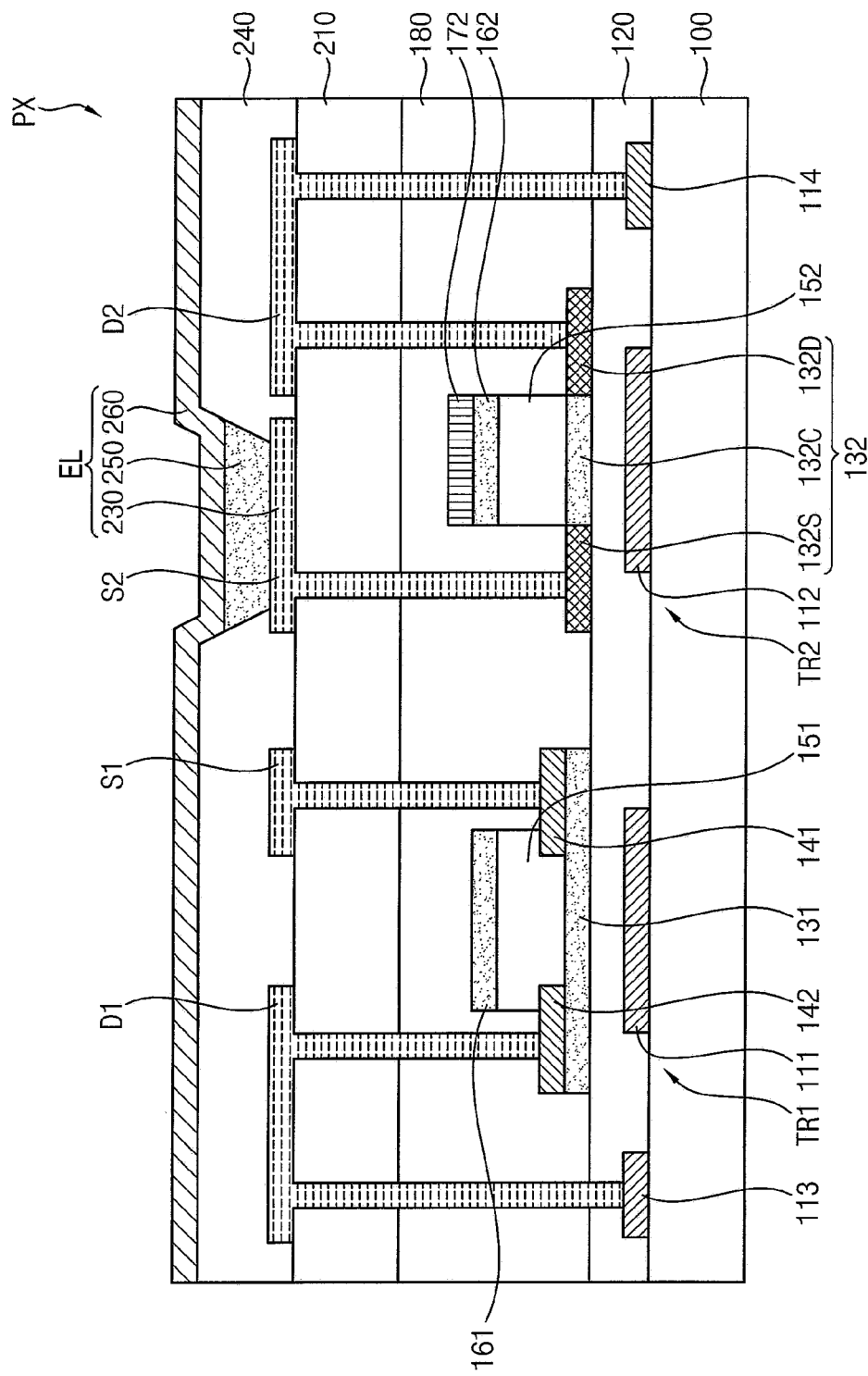
FIG. 9 is a schematic cross-sectional view illustrating a pixel according to an embodiment.

FIG. 9 is a schematic cross-sectional view illustrating a pixel according to an embodiment.

The pixel PX described with reference to FIG. 9 may be substantially the same as or similar to the pixel PX described with reference to FIG. 7 except that the pixel PX may further include a data line 113 and a driving voltage line 114. Accordingly, descriptions regarding repeated elements will be omitted.

Referring to FIG. 9, in an embodiment, a data line 113 and a driving voltage line 114 may be disposed between the substrate 100 and the buffer layer 120. The data line 113 and the driving voltage line 114 may be formed on substantially a same layer as the first gate electrode 111 and the conductive pattern 112, may be formed of substantially a same material as the first gate electrode 111 and the conductive pattern 112, and may be spaced apart from each other. The data line 113 and the driving voltage line 114 may be spaced apart from the first gate electrode 111 and the conductive pattern 112.

The data line 113 may be electrically connected to the first drain electrode D1. For example, the first drain electrode D1 may contact the data line 113 through a contact hole formed in the buffer layer 120, the insulation interlayer 180, and the planarization layer 210. The driving voltage line 114 may be electrically connected to the second drain electrode D2. For example, the second drain electrode D2 may contact the driving voltage line 114 through a contact hole formed in the buffer layer 120, the insulation interlayer 180, and the planarization layer 210.

The display device according to the embodiments may be applied to a display device included in a computer, a notebook, a mobile phone, a smartphone, a smart pad, a PMP, a PDA, an MP3 player, or the like.

Although the display devices and the methods of manufacturing the display devices according to the embodiments have been described with reference to the drawings, the illustrated embodiments are examples, and may be modified and changed by a person having ordinary knowledge in the relevant technical field without departing from the technical spirit of the disclosure. Accordingly, the scope of the disclosure should not be limited by the disclosed embodiments, but rather should be interpreted in accordance with the following claims including their equivalents.

What is claimed is:

1. A display device, comprising:
a first gate electrode disposed on a substrate;
a buffer layer disposed on the first gate electrode;
a first active pattern disposed on the buffer layer, the first active pattern overlapping the first gate electrode and including an oxide semiconductor;
a second active pattern disposed on the buffer layer, spaced apart from the first active pattern, and including an oxide semiconductor, the second active pattern comprising:
a channel region; and
a source region and a drain region respectively disposed at ends of the channel region;
a source pattern and a drain pattern respectively disposed at ends of the first active pattern;
a first insulation pattern disposed on the first active pattern between the source pattern and the drain pattern;
a second insulation pattern disposed on the channel region of the second active pattern while not covering at least a portion of each of the source region and the drain region;
a first oxygen supply pattern disposed on the first insulation pattern, the first oxygen supply pattern supplying oxygen to the first active pattern;
a second oxygen supply pattern disposed on the second insulation pattern, the second oxygen supply pattern supplying oxygen to the second active pattern; and a second gate electrode disposed on the second oxygen supply pattern.

2. The display device of claim 1, wherein the first insulation pattern does not cover a distil end of the first active pattern.

3. The display device of claim 1, wherein the second oxygen supply pattern does not cover at least a portion of each of the source region and the drain region.

4. The display device of claim 1, wherein each of the first oxygen supply pattern and the second oxygen supply pattern includes an oxide semiconductor.

5. The display device of claim 4, wherein the first oxygen supply pattern, the second oxygen supply pattern, the first active pattern, and the second active pattern include a same material.

6. The display device of claim 4, wherein the first oxygen supply pattern and the second oxygen supply pattern include a material different from a material of the first active pattern and the second active pattern.

7. The display device of claim 1, further comprising:
an insulation interlayer overlapping the first oxygen supply pattern and the second gate electrode on the buffer layer;
a first source electrode and a first drain electrode disposed on the insulation interlayer and respectively electrically connected to the source pattern and the drain pattern; and
a second source electrode and a second drain electrode disposed on the insulation interlayer and respectively electrically connected to the source region and the drain region.

8. The display device of claim 7, further comprising a planarization layer disposed on the insulation interlayer,
wherein the first source electrode, the first drain electrode, the second source electrode, and the second drain electrode are disposed on an upper surface of the planarization layer.

9. The display device of claim 7, further comprising:
a data line disposed between the substrate and the buffer layer, the data line being electrically connected to the first drain electrode.

10. The display device of claim 7, further comprising:
a driving voltage line disposed between the substrate and the buffer layer, the driving voltage line being electrically connected to the second drain electrode.

11. The display device of claim 7, further comprising a planarization layer disposed on the insulation interlayer, wherein
the first source electrode includes:
a first lower source electrode disposed on an upper surface of the insulation interlayer; and
a first upper source electrode disposed on an upper surface of the planarization layer and electrically connected to the first lower source electrode,
the first drain electrode includes:
a first lower drain electrode disposed on the upper surface of the insulation interlayer; and
a first upper drain electrode disposed on the upper surface of the planarization layer and electrically connected to the first lower drain electrode,
the second source electrode includes:
a second lower source electrode disposed on the upper surface of the insulation interlayer; and
a second upper source electrode disposed on the upper surface of the planarization layer and electrically connected to the second lower source electrode, and
the second drain electrode includes:
a second lower drain electrode disposed on the upper surface of the insulation interlayer; and
a second upper drain electrode disposed on the upper surface of the planarization layer and electrically connected to the second lower drain electrode.

12. The display device of claim 11, further comprising:
a protective layer disposed between the insulation interlayer and the planarization layer, the protective layer overlapping the first lower source electrode, the first lower drain electrode, the second lower source electrode, and the second lower drain electrode.

13. The display device of claim 7, further comprising:
a conductive pattern disposed between the substrate and the buffer layer and overlapping the second active pattern.

14. The display device of claim 13, wherein the conductive pattern is electrically connected to the second source electrode or the second gate electrode.

15. A display device, comprising:
a first transistor disposed on a substrate and having a bottom gate structure, the first transistor including a first active pattern including an oxide semiconductor;
a second transistor disposed on the substrate and having a top gate structure, the second transistor including a second active pattern including an oxide semiconductor;
a first oxygen supply pattern disposed on the first active pattern, the first oxygen supply pattern supplying oxygen to the first active pattern; and
a second oxygen supply pattern disposed on the second active pattern, the second oxygen supply pattern supplying oxygen to the second active pattern, wherein
the first oxygen supply pattern does not cover a distil end of the first active pattern.

16. The display device of claim 15, further comprising:
a pixel including a pixel circuit and a light-emitting element electrically connected to the pixel circuit; and
a scan driver that supplies a scan signal to the pixel circuit.

17. The display device of claim 16, wherein the first transistor and the second transistor are included in the scan driver.

18. The display device of claim 16, wherein the first transistor and the second transistor are included in the pixel circuit.

19. The display device of claim 18, wherein the second transistor is electrically connected to the light-emitting element.

20. A method of manufacturing a display device, the method comprising:
forming a first gate electrode on a substrate;
forming a buffer layer on the first gate electrode;
forming a first active pattern overlapping the first gate electrode and including an oxide semiconductor;
forming a second active pattern spaced apart from the first active pattern and including an oxide semiconductor on the buffer layer;
forming a source pattern and a drain pattern respectively at ends of the first active pattern;
forming a first insulation pattern on the first active pattern between the source pattern and the drain pattern;
forming a second insulation pattern on the second active pattern;
forming a first oxygen supply pattern on the first insulation pattern;
forming a second oxygen supply pattern on the second insulation pattern; and forming a second gate electrode on the second oxygen supply pattern, wherein the first insulation pattern, the second insulation pattern, the first oxygen supply pattern, the second oxygen supply pattern, and the second gate electrode are formed by a photolithography process using a first halftone mask, and the first oxygen supply pattern does not cover a distil end of the first active pattern.

21. The method of claim 20, wherein the forming of the first insulation pattern, the second insulation pattern, the first oxygen supply pattern, and the second oxygen supply pattern comprises, sequentially forming an insulation layer and an oxygen supply layer on the first active pattern and the second active pattern; and heat-treating the oxygen supply layer to supply oxygen to the first active pattern and the second active pattern from the oxygen supply layer.

22. The method of claim 20, wherein the first active pattern, the second active pattern, the source pattern, and the drain pattern are formed by a photolithography process using a second halftone mask.

\* \* \* \* \*